United States Patent [19]

Cho et al.

[11] 3,931,597
[45] Jan. 6, 1976

[54] APPARATUS AND METHOD FOR PHASE-ENCODED SURFACE WAVE DEVICES

[75] Inventors: Frederick Y. Cho; Bill J. Hunsinger, both of Fort Wayne, Ind.

[73] Assignee: The Magnavox Company, Fort Wayne, Ind.

[22] Filed: Feb. 4, 1974

[21] Appl. No.: 439,482

[52] U.S. Cl.................. 333/30 R; 310/9.8; 333/72
[51] Int. Cl.$^2$.. H03H 9/02; H03H 9/26; H03H 9/30; H01L 41/04
[58] Field of Search............... 333/30 R, 72; 310/9.8

[56] References Cited
UNITED STATES PATENTS
3,727,718  4/1973  Whitehouse ..................... 333/30 X Primary Examiner—James W. Lawrence
Assistant Examiner—Marvin Nussbaum
Attorney, Agent, or Firm—Thomas A. Briody; Joe E. Barbee; William J. Streeter

[57] ABSTRACT

Apparatus and method for phase-encoding electro-acoustic electro-acoustic elements, elements of an acoustic surface wave device to provide preselected transducer characteristics. By altering the position of a transducer element or portions of a transducer element, the phase of the acoustic wave propagated from, or the phase of the electrical signal received by the transducer element can be varied by an amount determined by the velocity of propagation of the acoustic wave.

By altering the location of the electro-elements, or portions thereof, from a position determined for example by amplitude-encoding techniques, a resultant signal produced by a plurality of electro-acoustic elements, element portions, or combination of elements and element portions can provide the preselected transducer characteristics. In addition, the elements or element portions can be located such that the overlap amplitude between adjacent electro-acoustic elements is substantially a constant, providing increased directionality for acoustic waves orignating at the transducer.

According to one embodiment, each electro-acoustic transducer can be phase-encoded permitting both an input and an output transducer to be phase-encoded with preselected characteristics.

According to a second embodiment, the elements or portions thereof of a first transducer are displaced relative to elements or portions thereof of a second transducer to provide appropriate device phase-encoding.

18 Claims, 4 Drawing Figures

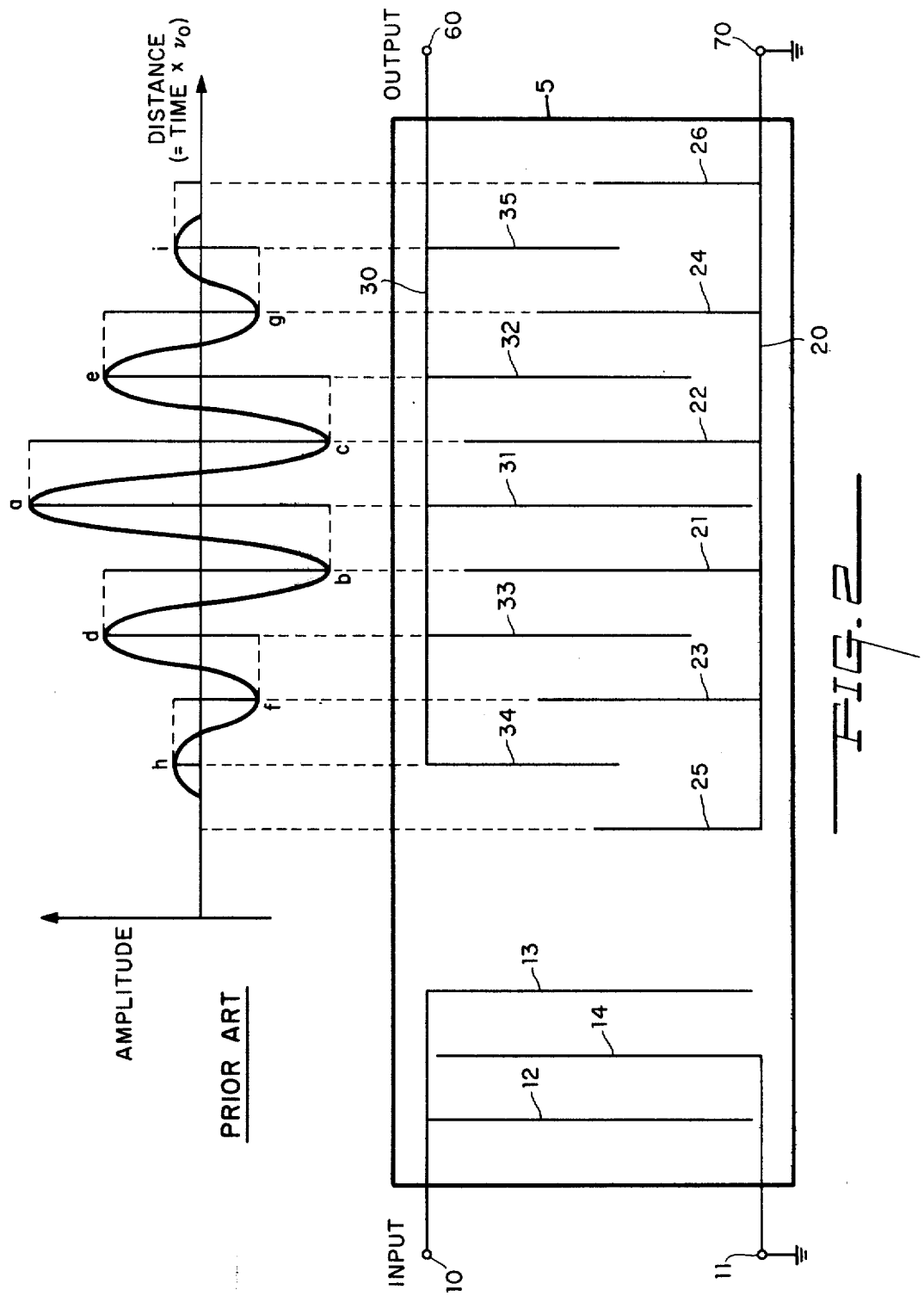

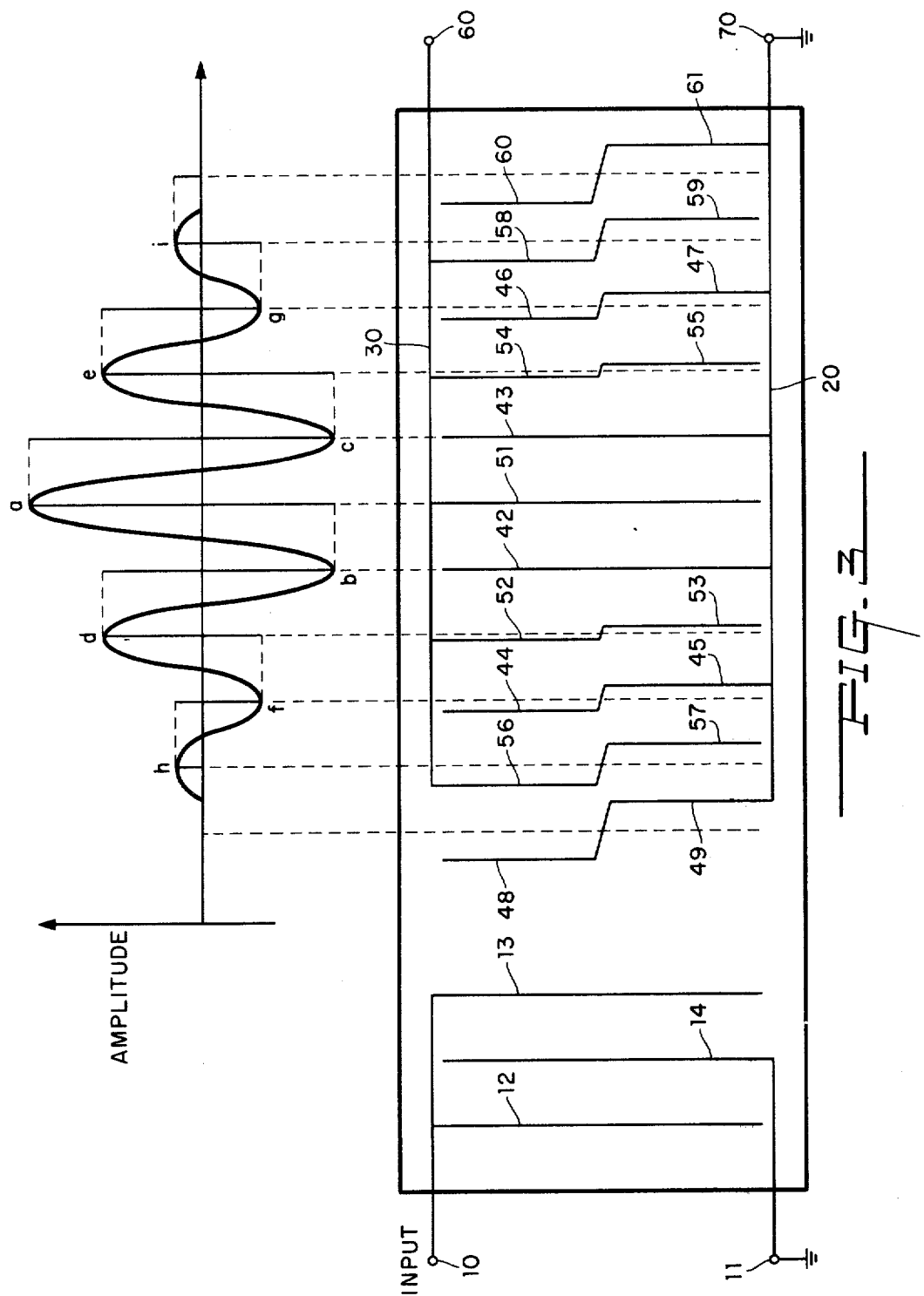

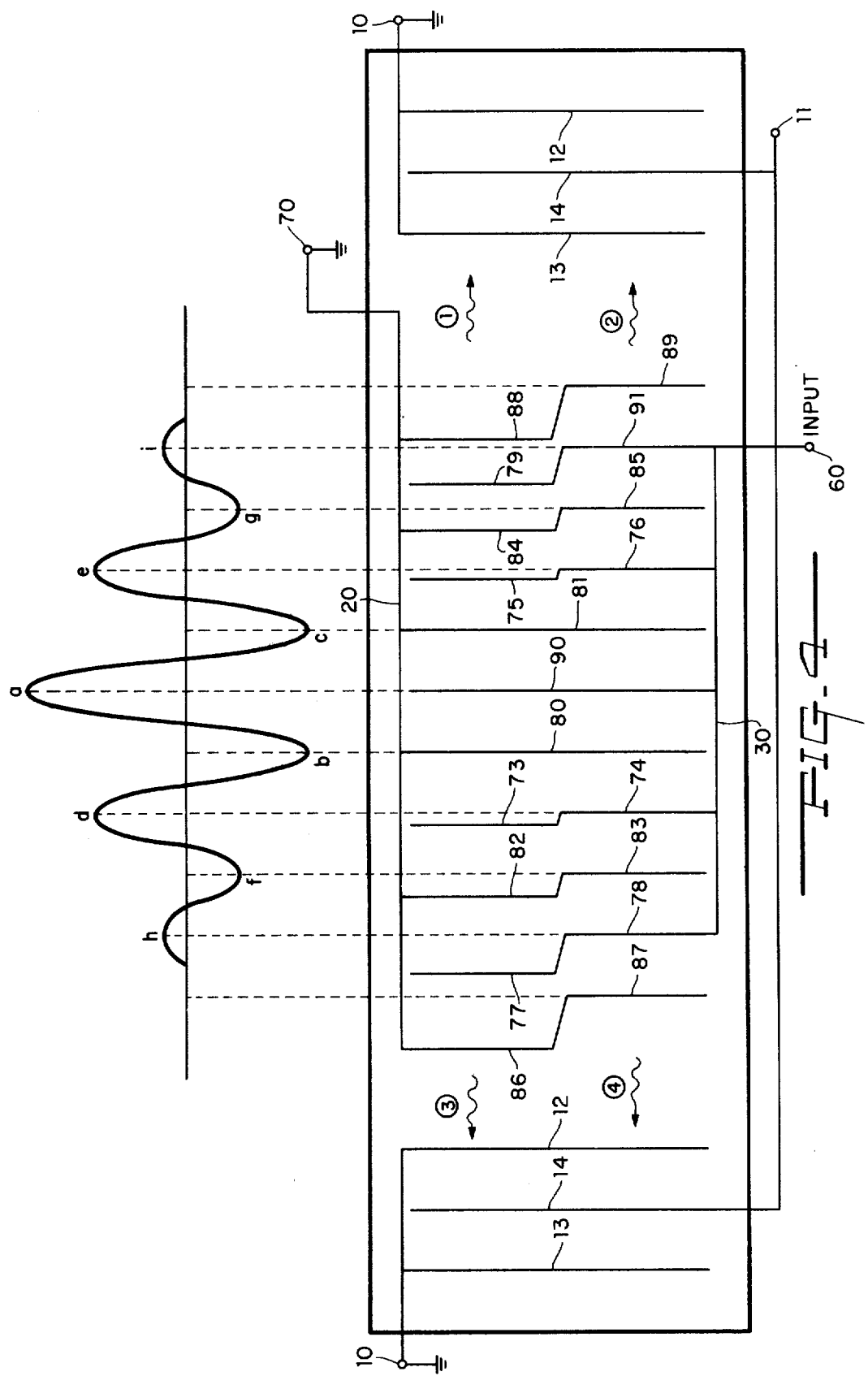

3,931,597

APPARATUS AND METHOD FOR PHASE-ENCODED SURFACE WAVE DEVICES

BACKGROUND OF THE INVENTION

1. Field of the Invention

This invention relates generally to acoustic surface wave devices and more particularly to techniques for synthesizing desired device frequency characteristics. The desired frequency characteristics are provided in the present invention by appropriate phase-encoding of the transducer elements as contrasted with the amplitude-encoding of the transducer elements of the prior art.

2. Description of the Prior Art

In acoustic surface wave devices, varying electric signals, applied to properly-positioned transducer electrodes deposited on a piezoelectric substrate, generate acoustic waves which propagate along the substrate surface. Correspondingly, the passage of acoustic waves on the surface of a piezoelectric substrate through a region in which properly-positioned transducer electrodes have been deposited, will generate an electric signal at the output of the transducer. These phenomena can be used to provide a group of electronic devices having predetermined transfer-function characteristics.

To provide specified frequency characteristics in an acoustic surface wave device, the desired characteristics, which are typically specified in the frequency domain, are transformed into a time domain representation. The time domain representation is chosen because of the correspondence to the physical situation in which an acoustic wave propagates with a velocity characteristic of the device substrate and interacts with the electro-acoustic elements of a transducer in an acoustic surface wave device. The propagation of the acoustic surface wave in the device corresponds to propagation along the time axis in the time domain representation.

The characteristics of the transducer elements, with which the propagating acoustic surface wave interacts, are chosen to produce an electrical analog of the function displayed in the time domain representation. In particular, one set of transducer elements, assigned an arbitrary polarity, is associated with the local time domain maxima, while a second set of transducer elements, arbitrarily assigned the opposite polarity, is associated with the local time domain minima. The magnitude of local maxima and minima of the time domain representation is reproduced in the acoustic surface wave device by appropriate amplitude of overlap between adjacent transducer elements of the two transducer elements sets, resulting in an amplitude-encoding of the transducer elements.

In reproducing the characteristics specified in the time domain representation, the interactive region of the acoustic surface wave transducer (i.e., the region of element overlap) typically increases from zero, reaches a maximum and decreases to zero. Thus a transducer, when used to generate acoustic surface waves, provides a relatively diffuse wave pattern. The generation of acoustic surface waves is therefore generally restricted in the prior art to a series of uniformly overlapping transducer elements to provide a relatively narrow region of propagation of the surface waves about a center frequency and is not suitable for imposition of specified characteristics. Such characteristics can typically be imposed only on the output transducer of an acoustic surface wave device.

It is therefore an object of the present invention to provide an improved acoustic surface wave device.

It is another object of the present invention to provide a method of modulating an acoustic surface wave device.

It is further object of the present invention to provide a method of achieving specific frequency characteristics for a device transfer function.

It is a still further object of the present invention to provide a method of phase-encoding of transducer elements in an acoustic surface wave device.

It is yet another object of the present invention in which desired frequency characteristics can be specified for both an input and an output transducer of the acoustic surface wave device.

It is still another object of the present invention to provide a method of generating acoustic surface waves having specified frequency characteristics in which the direction of propagation of the surface waves is approximately perpendicular to the transducer elements.

It is a more particular object of the present invention to provide acoustic surface wave transducers which produce signal components, generated by an associated transducer element group, having specified characteristics.

It is yet another particular object of the present invention to provide an acoustic surface wave device in which a phase-encoded electro-acoustic transducer is functionally equivalent to an amplitude-encoded electro-acoustic transducer.

It is still another object of the present invention to control the phase of a signal associated with an element of an electro-acoustic transducer by altering the element position.

It is yet a further object of the present invention to alter the phases of signals associated with elements of an electro-acoustic transducer, wherein a combination of the phase-altered signals produces a signal of preselected phase and amplitude.

SUMMARY OF THE INVENTION

The aforementioned and other objects of the present invention are accomplished by providing an electro-acoustic transducer comprised of a conducting material deposited on a piezoelectric material. The transducer includes groups of interleaved elements or groups of portions of interleaved elements which are generally displaced from a position indicated for an amplitude-encoded transducer by a time domain representation of desired device characteristics. The vector combination of the signals from the element or element sections of a transducer element pair provides, by appropriate location relative to an amplitude-encoded transducer element, a resulting signal of the phase and amplitude indicated in the time domain representation.

The elements or element sections of an electro-acoustic transducer are disposed so as to be generally parallel to adjacent elements or element sections along the entire element length, thereby increasing the directionality of generated acoustic waves. Directionality of wave generation is compromised, in the prior art, by variable overlap of adjacent elements typically required for producing a specified frequency response.

A first electro-acoustic transducer, exchanging signals with a second electro-acoustic transducer, can be comprised of a plurality of transducer sections. The location of the transducer section elements relative to the second electro-acoustic transducer elements can contribute to producing the specified frequency response.

These and other features of the invention will be understood upon the reading of the following description in conjunction with the drawings.

BRIEF DESCRIPTION OF THE DRAWINGS

FIG. 2 is a schematic representation of the implementation characteristics specified in the time domain by prior art amplitude-encoded transducer elements in an acoustic surface wave device.

FIG. 3 is a schematic representation of the implementation of characteristics specified in the time domain by phase-encoded transducer elements in an acoustic surface wave device according to one embodiment of the present invention.

FIG. 4 is a schematic representation of the implementation of characteristics specified in the time domain by separated phase-encoded transducer sections in an acoustic surface wave device according to a second embodiment of the present invention.

DESCRIPTION OF THE PREFERRED EMBODIMENT

Detailed Description of the Figures

Figure 1:
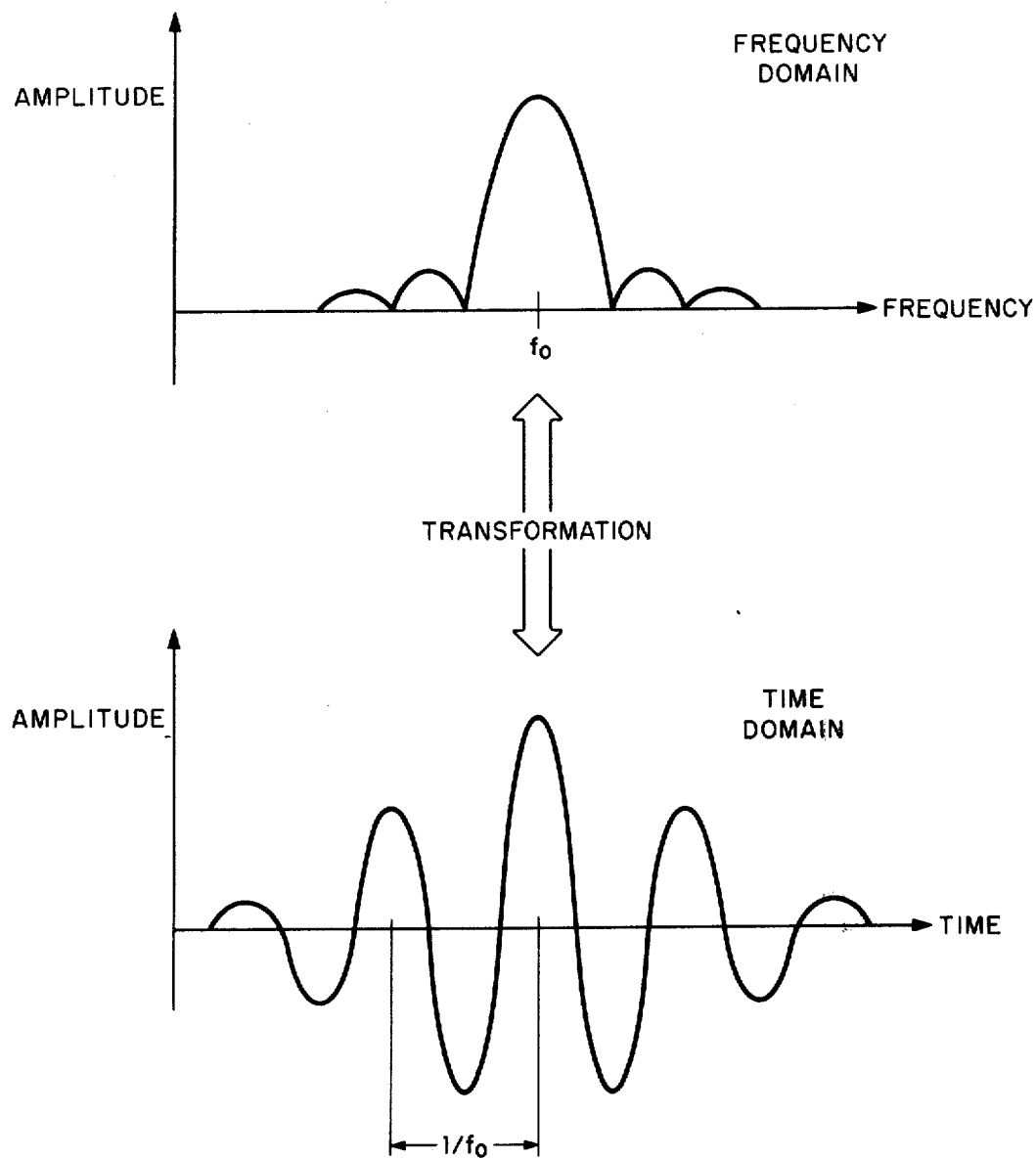
FIG. 1 is a schematic diagram of the transformation between the frequency domain and the time domain.

Referring first to FIG. 1, a schematic representation of a transformation of a function in the frequency domain, i.e. a relationship between amplitude and frequency, into the time domain, i.e. a relationship between amplitude and time, is demonstrated. This transformation is typically effected by means of the techniques of Fourier analysis. The significance of this transformation is based on the fact that the desired characteristics for a device are generally more conveniently specified in the frequency domain. The device design, on the other hand, is frequently more easily synthesized from characteristics specified in the time domain.

Referring next to FIG. 2, the use of characteristics, specified in the time domain, to design the transducer element configuration according to the prior art is shown. The first step is to relate the time domain characteristics to characteristics associated with the acoustic surface wave device. This relationship, shown on the axis of the time domain representation, is accomplished by multiplying the coordinates along the time axis by $v_o$, the propagation velocity of acoustic surface wave in the device.

Transducer electrodes are typically associated in the prior art with local maxima and minima of the desired device characteristic. One set of transducer elements deposited on Substrate 5 and coupled to a common Conducting Region 30 are associated with local maxima. Another set of electrodes, coupled to a common Conducting Region 20, are associated with local minima. The Conducting Regions are also assigned polarities which are arbitrary as will be clear to one skilled in the art.

Two adjacent electrodes, e.g. Electrode 31 coupled to Conducting Region 30, and Electrode 21 coupled to Conducting Region 20, respond to an acoustic wave pulse located momentarily between Electrode 31 and Electrode 21 by generating an electrical signal between Terminal 60, coupled to Conducting Region 30, and Terminal 70, coupled to Conducting Region 20. In the preferred embodiment, the direction of propagation of an acoustic wave traversing the Transducer Region 15 generally perpendicular to the electrodes, while the wave front has a generally uniform amplitude. Thus the acoustic wave pulse located between Electrode 21 and Electrode 31 produced a signal between Terminal 60 and Terminal 70 substantially proportional to the amplitude of the overlapping regions of the two adjacent electrodes. In designing the surface device therefore, the overlap amplitude of Electrode 31 and Electrode 21 provide a quantity proportional to the amplitude of the curve in the time domain between local maxima $a$ and local minima $b$.

When the propagating acoustic wave pulse is momentarily located between Electrode 21 and Electrode 33 an electric signal of polarity opposite to that generated when the surface wave pulse is located between Electrode 31 and Electrode 21, is generated across Terminal 60 and Terminal 70. In this case, in order that the amplitude of the signal generated by Electrode 33 and Electrode 21 has a proper amplitude for reconstruction of the time domain function, the amplitude of the overlap between Electrode 33 and Electrode 21 has the same ratio to the amplitude of the overlap between Electrode 21 and Electrode 31 as the amplitude between maxima $d$ and minima $b$ has to the amplitude between minima $b$ and maxima $a$.

The remaining Electrodes 22, 23, 24, 25, 26, 32, 34, and 35 are specified in a similar manner. The result in designing the Electrodes according to this procedure is that a reproduction of the function in the time domain, and consequently of the frequency domain, is obtained for the transducer. That is, the response to acoustic surface wave by the transducer or the generation of surface waves by the transducer will have the response specified in the frequency domain.

Referring next to FIG. 3, the implementation of specified time domain characteristics by a transducer according to one embodiment of the present invention is shown. In this embodiment of the present invention, Terminal 10 and Terminal 11 provide electrical coupling to one electro-acoustic transducer, shown schematically as being comprised of Electrode Elements 12, 13, and 14, while Terminal 70 and Terminal 60 provide electrical coupling to a second electro-acoustic transducer. Conducting Region 20 is coupled to Terminal 70 and arbitrarily assigned a first polarity while Conducting Region 30 is coupled to Terminal 60 and arbitrarily assigned a second polarity. An Electrode 51, coupled to Conducting Region 30, is associated with the position of the largest of a local maxima $a$. Referring next to minima $b$ of the time domain, an Electrode 42 is positioned at the minima and in the preferred embodiment extends nearly to the Conducting Region 30. The electric signal generated by an acoustic wave in the region between Electrode 42 and Electrode 51 is proportional to the amplitude between local maxima $a$ and local minima $b$.

The Electrode adjacent to Electrode 42 and corresponding to local maxima $d$ is divided into Electrode Section 52 and a substantially equal Electrode Section 53. In the preferred embodiment of this configuration, these two Electrode Sections are coupled together and are symmetrically displaced about the position specified by maxima $d$ in the time domain. However, other arrangements will be clear to those skilled in the art.

The Electrode Sections extend substantially the entire length of adjacent Electrode 42. Therefore the amplitude of the overlap between adjacent Electrodes is substantially equal.

In addition, the Electrode corresponding to the symmetrical local maxima and symmetrical local minima of the time domain representation both have Electrode Sections displaced by an equal amount and in the same direction. As the Electrodes are farther removed from the center of the transducer, the displacement of the Electrode sections becomes increasingly larger.

Referring next to FIG. 4, a second embodiment of the present invention is illustrated. In this Figure, Terminals 10 and 11 provide electrical coupling to two substantially identical transducers comprised of Electrode Elements 12, 13, and 14. As illustrated in FIG. 4, these two transducers represent Portions of an Output Transducer. However, it will be clear to one skilled in the art that these transducers can represent portions of an input transducer.

Conducting Region 20 is coupled to Terminal 70 while Conducting Region 30 is coupled to Terminal 60. Electrode Sections 91, 76, 90, 74, and 78 are coupled to Conducting Region 30 while Electrode Sections 88, 84, 81, 80, 82, and 86 are coupled to Conducting Region 20. In the preferred embodiment, the set of Electrode Sections coupled to Conducting Region 20 and to Conducting Region 30 extend approximately half the distance between Conducting Region 30 and Conducting Region 20. Furthermore, the positions of these Electrode Sections are substantially the positions indicated by the local maxima and local minima of the time domain diagram. Each of the Electrode Sections has another Electrode Section coupled to it. For example, Section 87 is coupled to Section 86, but displaced from Section 86. Similarly, Section 89 is coupled to Section 88. Furthermore, Section 89 is displaced from Section 88 by the same amount and in the same direction as Section 87 is displaced from Section 86. Similarly, each Electrode Section coupled to a Conducting Region is coupled to another Electrode Section. When the second Electrode Section coupled to the first Electrode Section is displaced therefrom, then another second Electrode Section is displaced for another first Electrode Section, the first Electrode Section symmetrically located with respect to portions of the Output Transducer, by an equal amount and in the same direction. The portions of the Output Transducer, similarly, are located symmetrically with respect to the undisplaced Sections of the Input Transducer. The second Electrode Section extends for substantially the distance remaining from the first Electrode Section to the opposite Conducting Region. Except for a small region coupling the first and second Electrode Sections, the Electrodes coupled to the conducting regions extend substantially the entire distance between the Conducting Regions and are substantially parallel to the other Electrodes.

Operation of the Preferred Embodiment

The operation of the preferred embodiment shown in FIG. 3 can be understood by considering the result of application of an electrical signal of the design center frequency between Terminals 60 and 70. The acoustic surface waves, launched toward Transducer Electrode Elements 12, 13, and 14, will have two components, one for each Electrode Section. Where the displacement from the position typically indicated by the local maxima or minima of the time domain representation is labeled d, then the acoustic surface wave generated by one Electrode Section will be retarded by time $d/v_o$ relative to an acoustic surface wave generated from the electrode of the prior art, while an acoustic surface wave generated by the second Electrode Section will be generated in advance of the acoustic surface wave generated by the electrode of the prior art, by a time $d/v_o$. Both the advanced and the retarded wave will be combined by the Electrode Elements 12, 13, and 14. The amplitude, because of the vectorial signal addition, will be diminished, while the symmetry of the displacement will produce a resulting signal at Terminal 10 and 11 which is in phase with a signal generated at the average Electrode Section position, i.e. at the position designated by the local maxima or minima of the time domain representation.

It will be clear to those skilled in the art that neither the symmetry of Electrode Section length nor the symmetry of Electrode Section displacement from the average position is essential. The essential feature is that the vector addition of acoustic surface waves generated by the electrode section results in the generation of an electrical signal which is of the proper phase and amplitude.

Referring to FIG. 4, an embodiment of phase-encoded surface wave devices is shown in which a coupled pair of transducers exchange surface waves with a first transducer. Electrode Section 89 and Electrode Section 87 are positioned equidistant from a first and a second of the coupled transducers respectively. In addition, Section 89 and Section 87 are equidistant from the second and the first of the coupled portion of the Output Transducers respectively. Coupled to Section 87, Electrode Section 86 is displaced toward the first and away from the second coupled transducer. Similary, Electrode Section 88, coupled to Section 89 is displaced toward the first and away from the second transducer. Because of the difference in the length of the propagation region, the acoustic surface waves, generated by Section 87 and 89 arrive at each of the coupled portions of the Output Transducers in-phase, while the acoustic surface wave generated at Section 86 arrives at a first portion of the coupled Output Transducer in advance of the in-phase signal and the acoustic surface wave generated at Section 88 arrives at a second portion of the coupled Output Transducer retarded from the in-phase signals.

Because the magnitude of the displacement of Section 86 from Section 87 is equal to the displacement of Section 88 from Section 89, and because Section 88 and 86 are substantially the same length, the signal generated by the coupled transducer will provide an in-phase signal of diminished amplitude. The amplitude can be arranged to provide an amplitude determined by the corresponding local maxima of the time domain representation for electrical signals of the design center frequency. Similarly, the entire time domain representation can be provided by appropriate displacement of the Electrodes Sections not located at the local maxima or minima indicated by the local maxima and minima of the time domain representation.

It will be apparent to one skilled in the art that Electrode Sections 86 and 88 can extend substantially the entire distance between Conducting Region 20 and Conducting Region 30. In such an embodiment, the displacement would have to be varied appropriately to provide the correct amplitude for the vector combination signal.

In either embodiment of the phase-encoding of the surface wave device, the Electrode elements are substantially parallel, except possibly for a small Electrode Section coupling region and extend substantially the entire distance between the Conducting Regions. This arrangement provides generated surface waves with greater directionality than can be achieved with the amplitudeencoded transducers.

It will be apparent to those skilled in the art that the phase-encoding of the transducer elements to provide predetermined characteristics without determining the amplitude-encoded transducer associated with the predetermined characteristics. The amplitude-encoded transducer has been used to clarify the operation of the instant invention.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. An electro-acoustic transducer for providing predetermined frequency characteristics, comprising:

an acoustic-wave propagating medium;

a first group of electrically-coupled conducting elements being substantially perpendicular to a first bus bar region connecting all the conducting elements of the first group, said first element group mechanically coupled to said medium;

a second group of electrically-coupled conducting elements being substantially perpendicular to a second bus bar region connecting all the conducting elements of the second group, said second element group mechanically coupled to said medium, wherein said first group of elements and said second group of elements are interleaved, a plurality of elements of said first and said second group of elements including electrically-coupled element sections, wherein at least one of said coupled sections of the plurality of elements is displaced from a predetermined position so as to be in a plane parallel to the element section to which it is electrically-coupled; and said predetermined position corresponds to a local maxima of a time domain diagram for each of said elements of said first group and wherein said predetermined position is related to local minima for each of said elements of said second group.

2. An electro-acoustic transducer for providing predetermined frequency characteristics, comprising:

an acoustic-wave propagating medium;

a first group of electrically-coupled conducting elements being substantially perpendicular to a first bus bar region connecting all the conducting elements of the first group, said first element group mechanically coupled to said medium;

a second group of electrically-coupled conducting elements being substantially perpendicular to a second bus bar region connecting all the conducting elements of the second group, said second element group mechanically coupled to said medium, wherein said first group of elements and said second group of elements are interleaved, a plurality of elements of said first and said second group of elements including electrically-coupled element sections, wherein at least one of said coupled sections of the plurality of elements is displaced so as to be in a plane parallel to the element section to which it is electrically-coupled; and wherein displacement of said at least one coupled section results in a signal of preestablished amplitude for one of said plurality of elements including said at least one coupled section, and wherein said preestablished amplitude corresponds to a local maxima of a time domain representation for an element of said first group.

3. An electro-acoustic device for providing predetermined frequency characteristics, comprising:

an acoustic-wave propagating medium;

a first transducer coupled to said medium, said first transducer including a first and a second group of electrodes, wherein said first and said second group of electrodes are interleaved;

a second transducer coupled to said medium for exchanging acoustic-wave signals with said first transducer, said second transducer including a third and a fourth group of electrodes which are substantially perpendicular to a first and second conducting region respectively, wherein said third and said fourth group of electrodes are interleaved, a plurality of said fourth group of electrodes having at least a coupled portion offset in alignment from another coupled portion; and wherein adjacent electrodes in said first transducer are substantially identical in length, and wherein adjacent electrodes in said second transducer are substantially identical in length.

4. The electro-acoustic device of claim 3 wherein signals relating to the second group of electrodes having at least an offset coupled portion combine to produce a signal of preselected phase and amplitude.

5. The electro-acoustic device of claim 3 wherein said first transducer includes a first section and a second symmetrically located with respect to said second transducer, one electrode of said second group of electrodes displaced from a preselected distance toward said first section, a second of said group of electrodes equally displaced from a distance equal to said preselected distance away from said second section.

6. In a surface wave device of the type including a transducer with interleaved electrodes, an improved method of encoding said surface wave transducer with preestablished frequency characteristics, the interleaved electrodes being substantially perpendicular to a conducting bus bar region, wherein the improvement comprising the steps of:

a. determining relative locations of transducer electrodes and overlap amplitudes for adjacent transducer electrodes from a time domain representation of said preestablished frequency characteristics;

b. dividing a plurality of said electrodes into coupled electrode sections;

c. positioning said coupled electrode sections on a surfacewave propagating material about said determined electrode locations, said coupled electrode sections positioned to provide a combined signal amplitude related to an overlap amplitude for a corresponding electrode section; and d. positioning undivided electrodes on said surface wave propagating material at said determined locations.

7. In a surface wave device including transducers with interleaved electrodes which are substantially perpendicular to a conducting bus bar region, an improved method of phase-encoding said surface wave device with preestablishing frequency characteristics, wherein the improvement comprises the steps of:
   a. determining relative location of transducer electrodes and overlap amplitudes for adjacent transducer electrodes from a time domain representation of said preestablished frequency characteristics;
   b. positioning at least a portion of a plurality of said electrodes on a surface-wave propagating material displaced from said electrode relative location, said positioning of said electrodes resulting in a signal determined by said overlap amplitude; and
   c. positioning undisplaced electrodes at said determined relative locations.

8. The electro-acoustic transducer of claim 7 wherein each electrode extends substantially a predetermined distance along an adjacent electrode.

9. An electro-acoustic transducer for providing preestablished frequency characteristics; comprising
   an acoustic-wave propagating medium;
   a first group of electrodes coupled to said medium and being substantially perpendicular to a first conducting region;
   a second group of electrodes coupled to said medium and being substantially perpendicular to a second conducting region, wherein said second group of electrodes interleaves with said first group of electrodes, a portion of a plurality of electrodes from said first and said second group displaced from positions determined by a time domain representation of said preestablished frequency characteristics.

10. An electro-acoustic device for providing preestablished frequency characteristics comprising:
   an acoustic-wave propagating medium;
   a first group of electrodes coupled to said medium;
   a second group of electrodes coupled to said medium wherein said first and said second group of electrodes are interleaved;
   a third group of electrodes coupled to said medium and being substantially perpendicular to a first conducting region;
   a fourth group of electrodes coupled to said medium and being substantially perpendicular to a second conducting region, wherein said third and said fourth group of electrodes are interleaved, wherein said third and said fourth group of electrodes are disposed to receive acoustic waves propagated by said first and said second group of electrodes, wherein at least a portion of each of a plurality of electrodes of said third and said fourth group are displaced from preselected positions by predetermined amount whereby the vector addition of signals generated by the third and fourth group of electrodes provide the preestablished frequency characteristics.

11. The electro-acoustic device of claim 10 wherein said predetermined amount is chosen to provide a desired amplitude.

12. The electro-acoustic device of claim 10 wherein said preselected positions and a desired amplitude are derived from a time-domain representation of said preestablished frequency characteristics.

13. The electro-acoustic device of claim 11 wherein an amount of overlap between adjacent electrodes of said third and said fourth group is substantially constant.

14. An electro-acoustic device having encoding of preestablished frequency characteristic, comprising:
   a first group of electrodes;
   a second group of electrodes, wherein said second group of electrodes is interleaved with said first group of electrodes, said first group of electrodes including a first plurality of sets of portions of electrodes, individual signals generated by each of said sets producing a preselected combined signal; said first and second group of electrodes being substantially perpendicular to a first and second conducting region respectively;
   an acoustic-wave propagating medium, said first and said second group of electrodes being coupled to said medium; and
   wherein said preselected combined signal is determined by a time-domain representation of said preestablished frequency characteristics.

15. An electro-acoustic device having preestablished frequency characteristics, said preestablished frequency characteristics specifying preestablished signal phases and preestablished amplitudes, comprising:
   an acoustic wave propagating medium;
   a first transducer coupled to said medium, said first transducer including a first plurality of interleaved electrodes substantially perpendicular to a first conducting region;
   a second transducer coupled to said medium, said second transducer including a second plurality of electrodes substantially perpendicular to a second conducting region, said second plurality of electrodes interleaved with said first plurality of electrodes wherein said second transducer produces output electrical signals in response to acoustic waves, said acoustic wave generated by input electrical signals to said first transducer, wherein electrodes in a plurality of sets of electrodes located in at least one of said first transducer and said second transducer produces signals having an amplitude intermediate to an amplitude produced by other electrodes combined intermediate signals of each set producing a composite signal having a phase and amplitude determined by said preestablished frequency characteristics.

16. An electro-acoustic device for providing predetermined frequency characteristics, comprising:
   an acoustic-wave propagating medium;
   a first electro-acoustic transducer mechanically coupled to said medium; and
   a second electro-acoustic transducer mechanically coupled to said medium, said second transducer including a multiplicity of interleaved electrodes substantially perpendicular to a conducting region, a plurality of said electrodes having a first portion and a second portion, wherein said first and second portions of electrodes of each group are positioned to produce a composite electrical signal of amplitude and time delay at said first transducer determined by said predetermined frequency characteristics upon electrical excitation of said each group.

17. The electro-acoustic device of claim 16 wherein adjacent interleaved electrodes have a substantially constant overlap amplitude.

18. An electro-acoustic device for providing predetermined frequency characteristics comprising:
an acoustic-wave propagating medium;
an electro-acoustic transducer mechanically coupled to said medium, said transducer including a multiplicity of interleaved electrodes, a plurality of said electrodes having a first portion and a second portion said electrodes arranged to respond to passage of a selected acoustic wave by generating a combined electrical signal of determined amplitude and phase having said predetermined frequency characteristics; and
wherein said combined signal of determined amplitude and phase corresponds to a time domain representation of said predetermined frequency characteristics.

* * * * *